(12) United States Patent
Uppaluri et al.

(10) Patent No.: US 8,181,137 B2
(45) Date of Patent: May 15, 2012

(54) LAYOUT VERSUS SCHEMATIC ERROR SYSTEM AND METHOD

(75) Inventors: Prasanti Uppaluri, Cary, NC (US); Doug Den Dulk, Apex, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 756 days.

(21) Appl. No.: 12/204,708

(22) Filed: Sep. 4, 2008

(65) Prior Publication Data

US 2009/0064077 A1 Mar. 5, 2009

Related U.S. Application Data

(60) Provisional application No. 60/969,933, filed on Sep. 4, 2007.

(51) Int. Cl.
*G06F 17/50* (2006.01)
*G06F 9/455* (2006.01)
*G06F 11/22* (2006.01)

(52) U.S. Cl. .................. 716/112; 716/111; 716/136

(58) Field of Classification Search .................. 716/107, 716/139
See application file for complete search history.

(56) References Cited

U.S. PATENT DOCUMENTS

| | | | | |
|---|---|---|---|---|
| 4,635,208 A * | 1/1987 | Coleby et al. | ................. | 716/102 |
| 5,220,512 A * | 6/1993 | Watkins et al. | ............... | 716/102 |
| 5,463,561 A * | 10/1995 | Razdan | .......................... | 716/103 |
| 5,787,006 A * | 7/1998 | Chevallier et al. | ............ | 716/111 |
| 6,009,252 A * | 12/1999 | Lipton | .......................... | 716/112 |
| 6,011,911 A * | 1/2000 | Ho et al. | ........................ | 716/112 |
| 6,045,584 A * | 4/2000 | Benzel et al. | .................. | 716/122 |
| 6,115,546 A * | 9/2000 | Chevallier et al. | ............ | 716/112 |
| 6,212,666 B1 * | 4/2001 | Gohl et al. | ...................... | 716/108 |
| 6,418,551 B1 * | 7/2002 | McKay et al. | ................. | 716/112 |
| 6,438,729 B1 * | 8/2002 | Ho | ................................. | 716/113 |
| 6,499,130 B1 * | 12/2002 | Lipton et al. | .................... | 716/52 |
| 6,505,323 B1 * | 1/2003 | Lipton et al. | .................. | 716/112 |
| 6,507,932 B1 * | 1/2003 | Landry et al. | ................. | 716/103 |
| 6,546,536 B1 * | 4/2003 | Nolan | ............................ | 716/102 |
| 6,584,606 B1 * | 6/2003 | Chiu et al. | ..................... | 716/112 |
| 6,606,735 B1 * | 8/2003 | Richardson et al. | .......... | 716/112 |
| 6,629,305 B2 * | 9/2003 | Ito et al. | ......................... | 716/119 |
| 6,684,379 B2 * | 1/2004 | Skoll et al. | ..................... | 716/102 |
| 6,799,307 B1 * | 9/2004 | Lipton et al. | .................. | 716/112 |
| 6,988,253 B1 * | 1/2006 | Lipton et al. | .................. | 716/112 |

(Continued)

OTHER PUBLICATIONS

"Cadence: Layout Versus Schematic (LVS) Verification", Mar. 15, 2002. Obtained from http://www.seas.upenn.edu/~eecad/cadence/lvs.html on Mar. 9, 2010. pp. 1-3.*

*Primary Examiner* — Stacy Whitmore
(74) *Attorney, Agent, or Firm* — Kenyon & Kenyon LLP

(57) ABSTRACT

According to various embodiments of the invention, systems and methods for presenting Layout Versus Schematic (LVS) errors within a layout using a visual circuit representation of the design and highlighting is provided. One embodiment includes overlaying the layout circuit representation on the schematic circuit representation with highlighting that indicates the LVS errors. The method of such an embodiment compares a layout netlist against a schematic netlist in order to identify the layout-versus-schematic errors, generates a graphical representation of the layout netlist and a graphical representation of the schematic netlist, displays an overlay of the graphical representation of the layout netlist with the graphical representation of the schematic netlist and then, highlights the identified layout-versus-schematic errors that are present.

24 Claims, 11 Drawing Sheets

U.S. PATENT DOCUMENTS

| | | | |
|---|---|---|---|
| 7,120,889 B2 * | 10/2006 | Chevallier et al. | 716/112 |
| 7,257,793 B2 * | 8/2007 | Okano et al. | 716/139 |
| 7,418,683 B1 * | 8/2008 | Sonnard et al. | 716/122 |
| 7,464,350 B1 * | 12/2008 | Ho | 716/106 |
| 7,480,878 B2 * | 1/2009 | Holesovsky et al. | 716/106 |
| 7,503,021 B2 * | 3/2009 | Boucher et al. | 716/136 |
| 7,603,641 B2 * | 10/2009 | Lin | 716/120 |
| 7,627,838 B2 * | 12/2009 | Keswick | 716/132 |
| 7,774,727 B2 * | 8/2010 | Arizono | 716/52 |
| 7,865,857 B1 * | 1/2011 | Chopra et al. | 716/119 |
| 2002/0166108 A1 * | 11/2002 | Rittman | 716/19 |
| 2003/0101420 A1 * | 5/2003 | Kamp et al. | 716/1 |
| 2003/0131323 A1 * | 7/2003 | McConaghy | 716/2 |
| 2003/0145300 A1 * | 7/2003 | Tran | 716/11 |
| 2005/0091626 A1 * | 4/2005 | Okano et al. | 716/11 |
| 2005/0268269 A1 * | 12/2005 | Coiley | 716/11 |
| 2006/0095884 A1 * | 5/2006 | Skoll et al. | 716/11 |
| 2006/0101368 A1 * | 5/2006 | Kesarwani et al. | 716/11 |
| 2007/0157140 A1 * | 7/2007 | Holesovsky et al. | 716/5 |
| 2008/0115102 A1 * | 5/2008 | Rittman | 716/19 |
| 2008/0127020 A1 * | 5/2008 | Rittman | 716/10 |
| 2009/0007033 A1 * | 1/2009 | Suri | 716/4 |

* cited by examiner

```
.GLOBAL VDD VSS              .SUBCKT ORAND3 OO AO A
.SUBCKT INV Z A              B C
MP1 Z A  VDD  VDD  P         X1 S1 A B OR2
MN1 Z A  VSS  VSS  N         X2 OO S1 C OR2
.ENDS                        X3 S2 A B AND2
                             X4 AO S2 C AND2
                             .ENDS
.SUBCKT NAND2 Z A B
MP1 Z A  VDD  VDD  P
MP2 Z B  VDD  VDD  P         .SUBCKT TOP CR SM A B C
MN1 Z A  S1   VSS  N         X1 S1 A B OR2
MN2 S1 B VSS  VSS  N         X2 S2 S1 C AND2
.ENDS                        X3 S3 A B AND2
                             X4 S4 S2 S3 NOR2
                             X5 CR S4 INV
.SUBCKT NOR2 Z A B           X6 S5 S6 A B C ORAND3
MP1 Z A  S1   VDD  P         X7 S7 S4 S5 AND2
MP2 S1 B VDD  VDD  P         X8 S8 S7 S6 NOR2
MN1 Z A  VSS VSS   N         X9 SM S8 INV
MN2 Z B  VSS VSS   N         .ENDS
.ENDS

.SUBCKT AND2 Z A B
X1 S1 A B NAND2
X2 Z  S1 INV
.ENDS

.SUBCKT OR2 Z A B
X1 S1 A B NOR2
X2 Z  S1 INV
.ENDS

EXAMPLE NETLIST
```

*Fig. 2*

Cell A
Partially Matched Nets Error

Schematic Net: R

| Count | Cell | | Count | Cell | Terminal(s) |
|---|---|---|---|---|---|
| 2 | PMOS (P) | | *1 | PMOS (P) | G |
| 2 | NMOS (N) | | *1 | NMOS (N) | G |

Layout Net: R

*Fig. 3*

LAYOUT VERSUS SCHEMATIC ERROR SYSTEM AND METHOD

CROSS-REFERENCE TO RELATED APPLICATIONS

This application claims the benefit of U.S. Provisional Application No. 60/969,933 filed Sep. 4, 2007, which is hereby incorporated herein by reference in its entirety.

TECHNICAL FIELD

The systems and methods of the present invention relate to tools used in the field of circuit design, and more particularly, some embodiments relate to design tools used in circuit design and layout design for integrated circuits.

DESCRIPTION OF RELATED ART

In semiconductor processing, a circuit design is typically converted into a layout design (also known as a layout or physical layout) such that the circuit can be fabricated on a semiconductor wafer. The layout design conventionally includes a dataset representing a plurality of geometric patterns that are used to create masks to form patterns on the layers that are used to create the semiconductor device on the wafer. Physical verification tools are frequently used to help ensure the integrity of the layout design for an integrated circuit. A process referred to as a Design Rule Check (DRC) process is a part of the physical verification of the design that determines whether the layout design satisfies the recommended foundry process parameters called Design Rules. Other physical verification processes can include Layout Versus Schematic (LVS) processing, XOR Checks, Electrical Rule Checks (ERC) and so on.

Layout Versus Schematic (LVS) processing can be used to determine whether a particular layout accurately corresponds to the original schematic of the design. Any mismatches between the schematic and the layout are listed as LVS errors. Examples of conventional LVS tools include the Assura™ and Dracula® tools offered by Cadence Design Systems, Inc.

FIG. 1 is a flowchart illustrating a conventional process for layout-versus-schematic processing. During layout-versus-schematic processing, the geometric shapes on different layers 105 in the layout are processed at 110 to extract the components and their connectivity 115 in the design. During extraction, the process takes a data file representing the layouts for the layers that will be used to create the circuit. The process then determines the semiconductor components that are represented by the layout dataset and examines the various layers and determines component connectivity. The process combines the extracted components and their connectivity into circuit combinations and generates a netlist representation of the layout database. This is typically represented as a hierarchical netlist 120. A similar process 130 can be used to extract the hierarchical netlist 135 from the schematic 125. The schematic might be, for example, a combination of DFII, Verilog and CDL netlists. FIG. 2 is a diagram illustrating a portion of an example netlist.

The hierarchical netlist 120 generated for the layout is compared at 140 against the schematic's hierarchical netlist 135 to determine whether there are any differences. Ideally, both netlists should be similar, and any differences might indicate the presence of an error. Errors might include, for example, missing connections, missing devices, shorts, opens, property errors, and so on. These are considered LVS errors.

Traditionally, the LVS errors identified by conventional LVS tools are reported as one or more ASCII files (i.e. error reports 145) in the logical domain in terms of the layout netlist devices and nets with respect to the schematic netlist. Coordinate information is typically provided for all the device errors to enable the layout designer to go back to the layout editor to fix the errors. One example of a conventional ASCII error report is illustrated in FIG. 3.

To correct these errors, the geometric shapes associated with the layout device and net errors are identified and modified. Traditionally, to debug and fix LVS errors, users locate the geometric shapes associated with a logical net or a device in the layout geometric database and modify it as necessary. In essence, the LVS errors are reported in the logical domain (nets and device errors) and these errors are located and fixed in the physical domain (layout geometric database). However, when an LVS error is identified, the user can refer to only two representations, either the netlist representation or the physical layout. The netlist is a lengthy alphanumeric listing that is difficult to assess in terms of a circuit design. Likewise, the layout is made up of thousands of polygons placed on different layers. Either representation is not conducive to quickly understanding and fixing the error.

For traditional systems that report LVS errors in the form of an ASCII format list, a user might be required to read through the lists to determine what connections and which device instances are incorrectly wired. When the LVS design errors are few, the user's burden of reading the LVS errors in the ASCII format lists and correlating those errors to the physical layout might be acceptable because the physical verification tools are able to isolate the LVS errors accurately. However, when the LVS errors are numerous or when there is a complex logical interaction between the errors, this system of listing the LVS errors in ASCII format may result in extremely large tables, making identifying and fixing the LVS errors cumbersome. This is because the relationship between the LVS errors or locality of LVS errors is not immediately obvious to the user based on the ASCII error report. In addition, when a complex error is hierarchical in nature, such an error is tedious to explain in an ASCII error report.

BRIEF SUMMARY OF EMBODIMENTS OF THE INVENTION

According to various embodiments of the invention, systems and methods for presenting Layout Versus Schematic (LVS) errors within a layout using a visual circuit representation of the design and highlighting is provided. One embodiment includes overlaying the layout circuit representation on the schematic circuit representation with highlighting that indicates the LVS errors. The method of such an embodiment compares a layout netlist against a schematic netlist in order to identify the layout-versus-schematic errors, generates a graphical circuit representation of the layout netlist and a graphical circuit representation of the schematic netlist, displays an overlay of a graphical representation of the layout netlist with the graphical representation of the schematic netlist, and, then, highlights the identified layout-versus-schematic errors that are present.

In another embodiment, a method and a tool used to identify layout-versus-schematic errors is provided. The method can include: comparing a layout netlist against a schematic netlist to identify one or more layout-versus-schematic errors; generating a graphical representation of the layout netlist; generating a graphical representation of the schematic netlist; displaying on a display an overlay of the graphical representation of the layout netlist with the graphical representation of the schematic netlist; and highlighting the one or more identified layout-versus-schematic errors on the display. In some embodiments, the highlighting can be accomplished by using a first color to identify one or more identified layout-versus-schematic errors on the display and a second color to identify where there are no layout-versus-schematic errors present. Additionally a layout editor can be provided to allow selecting, or probing, and correcting one or more of the identified layout-versus-schematic errors.

In one embodiment, displaying the overlay representation and highlighting the one or more identified layout-versus-schematic errors on the display results in a traversable hierarchy of underlying logic of a cell. The traversable hierarchy can allow viewing or editing of the underlying logic of the cell. Additionally, results from an analysis tool can be highlighted, where analysis tools can include, for example, a timing analysis tool and an engine used to identify critical paths.

In other embodiments the step of displaying includes displaying only a subset of the identified layout-versus-schematic errors, and the subset can be defined, for example, by a quantity of errors, error type, error source, a specified net, or a specified device. Further, the method can be implemented to display a layout-versus-schematic error and a predetermined number of levels around the displayed layout-versus-schematic error. Still further, a plurality of subsets of identified layout-versus-schematic errors can be displayed sequentially.

The method can be implemented such that highlighting is restricted to a subset of the identified layout-versus-schematic errors, and the subset can be defined, for example, by a quantity of errors, error type, error source, a specified net, or a specified device. Also, the highlighting can be accomplished using a plurality of different highlighting styles to highlight a plurality of different classes of errors. Furthermore, displaying the overlay and highlighting the one or more identified layout-versus-schematic errors on the display can be performed such that it results in a single graphical representation that can be searched, or panned and tilted through, and zoomed. For example, the representation can be scrolled across or up and down as well as zoomed into and out of. Also, the single graphical representation can be generated on the fly and displayed in real-time. The described methods can be repeated after one or more identified layout versus schematic errors are corrected, thereby updating the display.

In another embodiment, the method can comprise toggling the display to show the graphical representation of the layout netlist, the graphical representation of the schematic netlist, and the overlay.

In further embodiments, a method of and tool for identifying layout-versus-schematic errors in a layout generated from a schematic is provided, where the method includes displaying a graphical representation of a circuit, wherein one or more layout errors are highlighted in the graphical representation of the circuit. In one embodiment, displaying a graphical representation of the schematic results in a traversable hierarchy of underlying logic of a cell, and the traversable hierarchy allows viewing or editing of the underlying logic of the cell. In some embodiments, the graphical representation of the circuit is generated by generating a graphical representation of the layout netlist, generating a graphical representation of the schematic netlist and combining the graphical representation of the layout netlist with the graphical representation of the schematic netlist. In other embodiments, the graphical representation of the circuit is generated by comparing a schematic netlist with a layout netlist and generating a graphical circuit representation representing a combination of the schematic netlist with the layout netlist.

In further embodiments, the highlighting comprises using a different color to identify and differentiate the layout-versus-schematic errors from the remaining portions of the graphical representation. In other embodiments, displaying the overlay and highlighting the one or more identified layout-versus-schematic errors on the display results in a hierarchy of underlying logic of a cell capable of being traversed. When the hierarchy is traversed, one is allowed to view or edit the underlying logic of the cell.

In yet other embodiments, the results from an analysis tool, such as a timing analysis tool or engine capable of identify critical paths, are also highlighted along with the layout-versus-schematic errors. In some embodiments, the higlighting of layout-versus-schematic errors can be restricted to a subset of the identified layout-versus-schematic errors. The definition of such a subset includes, but is not limited to, quantity of errors, error type, error source, specified net, and specified device.

In yet further embodiments, a method identifies errors in a layout that is generated from a schematic. The identification can be performed by displaying a graphical circuit representation of the schematic, wherein one or more layout errors are highlighted in the graphical circuit representation.

In other embodiments, a method is provided that compares a layout netlist against a schematic netlist to identify one or more layout-versus-schematic errors, generates a comparison of the layout netlist and the schematic netlist, displays a graphical circuit representation of the layout netlist compared with the schematic netlist, and highlights the one or more identified layout-versus-schematic errors in the graphical circuit representation.

BRIEF DESCRIPTION OF THE DRAWINGS

The present invention, in accordance with one or more various embodiments, is described in detail with reference to the appended drawings. The drawings are provided for purposes of illustration only, and merely depict example embodiments of the invention. These drawings are provided to facilitate the reader's understanding of the invention and shall not be considered limiting of the breadth, scope, or applicability of the invention.

FIG. 2 is a diagram illustrating an example of a portion of a netlist.

FIG. 3 is an example of a conventional ASCII error report.

DETAILED DESCRIPTION OF THE INVENTION

Figure 1:
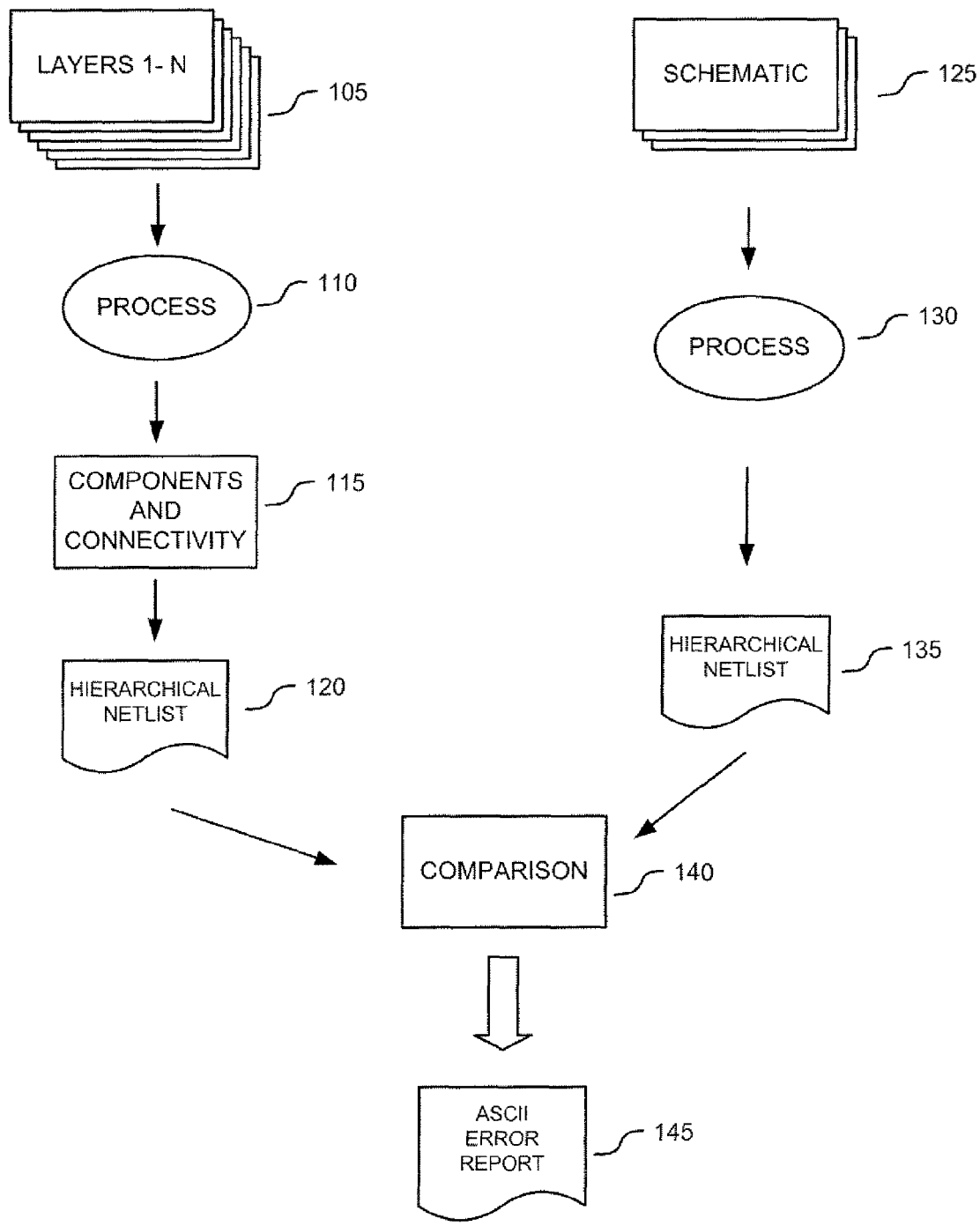
FIG. 1 is a flowchart illustrating a conventional process for layout-versus-schematic processing.

In accordance with one embodiment of the invention, a graphical debugging system for LVS is provided. More particularly, the invention can be implemented in some embodiments to identify, isolate and correct logical errors in the layout design using a tool that provides a graphical view of the LVS errors. In one embodiment, the tool is configured to generate graphical hierarchical circuit representations for the layout and the schematic from the netlist representations. In a further embodiment, the tool is configured to compare the netlist representations and to generate a graphical representation with highlighted errors uncovered by the comparison.

For example, in one embodiment, the tool is configured to overlay the layout circuit representation over the schematic circuit representation based on the comparison results. In other words, the combined dataset can be used to generate a graphic representation of the circuit and display this representation to the user. Accordingly, devices and nets that map to each other between the schematic and the layout can be effectively 'overlaid' on top of each other in a single representation.

Because the two datasets may not match (for example, due to LVS errors), the combined data set will, in some embodiments, show areas of mismatch. The tool can thus be configured such that mismatches or LVS errors such as, for example, missing devices, missing nets, property errors and incorrect connections, are highlighted in the combined or overlaid representation. Accordingly, in one implementation, the displayed representation can be a combination of the layout and schematic representations that provides a single graphical representation with the differences between the two compared representations highlighted.

As one example, the nets or devices that are present in the schematic, but not present in the layout, might be highlighted in one color, while the nets or devices that are missing in the schematic, but are present in the layout, might be represented in another color. Further to this example, nets and devices that match between the schematic and the layout can be displayed in yet another color. Incorrect connections can be highlighted similarly. As yet a further example, if a net in the schematic is connected to ten devices and it is partially matched to a net in the layout that is connected to seven devices, only the portion of the net that connects to the three additional schematic devices will be highlighted.

In the above example, inconsistencies or errors are highlighted using different colors to facilitate identification on a color display. As these examples serve to illustrate, LVS errors identified in the comparison can be depicted on the overlaid representation in a number of different ways to highlight the errors. For example, color coding, shading, highlighting, holding, altering line widths or thicknesses, flashing representations, brightness or contrast variations, outlining areas of interest, pointers and so on can be used to provide a visual indication of errors and mismatches. Additionally, a key can be provided to indicate to the user which color, shade or other modification is used to show which types of errors or inconsistencies. Further, different highlighting styles (for example, different colors or different schemes) can be used to identify different types or classes of errors.

Figure 4:
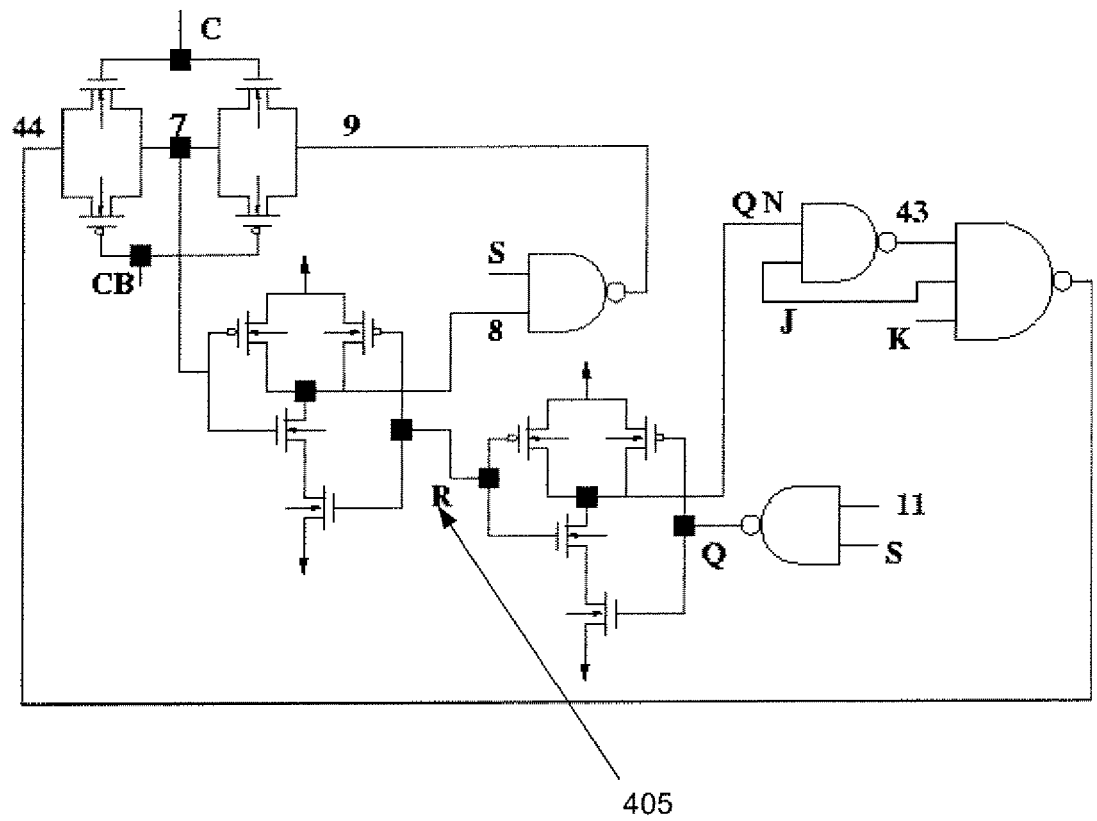
FIG. 4 is an example of a schematic circuit representation.
Figure 5:
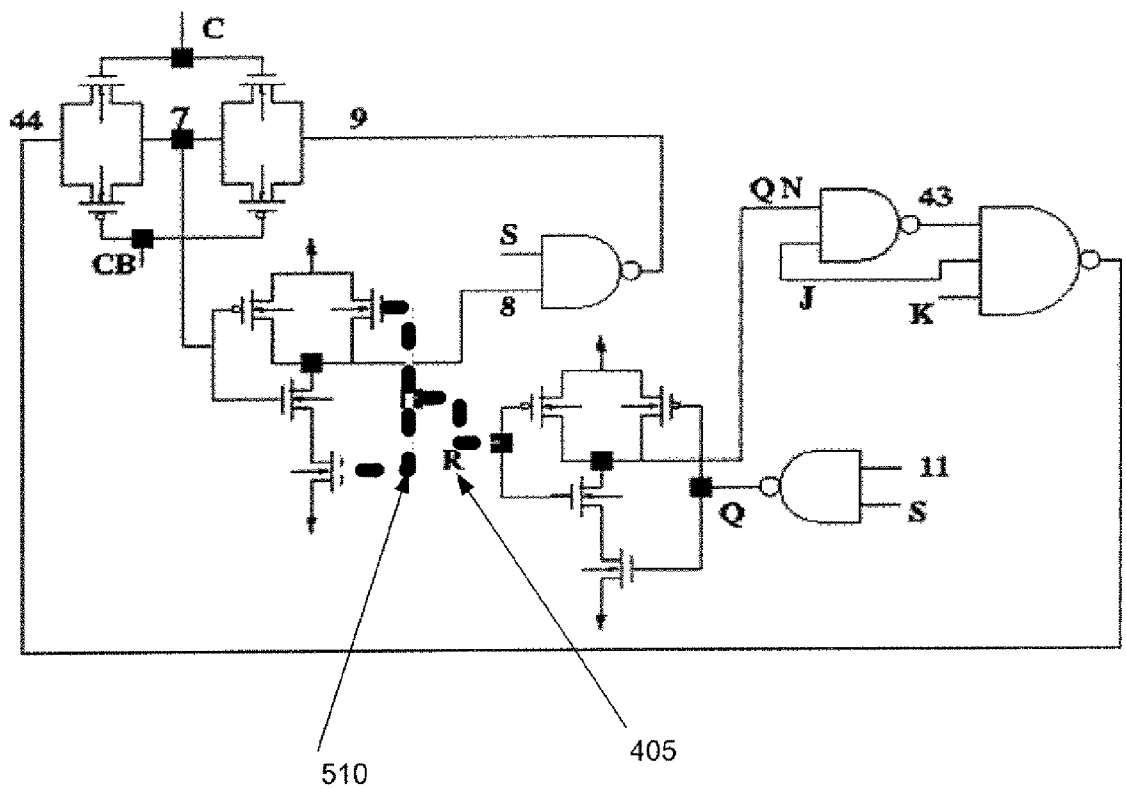
FIG. 5 is an example of a schematic circuit representation with an LVS error highlighted.

One example of highlighting an error is shown by contrasting FIG. 4 and FIG. 5. FIG. 4 is an example of a schematic circuit representation before the highlighting is applied. In contrast, FIG. 5 is an example of the same schematic circuit representation using dashed lines of increased thickness 510 to highlight that net R (405) has an LVS error. In this particular instance, the highlighted LVS error (inconsistency between layout and schematic) indicates missing connections in net R. This inconsistency possibly resulted from net R being connected to one P and one N transistor in the layout while net R is connected to two P and two N transistors in the schematic.

In a further embodiment, probing can be provided from the circuit representation to the geometrical database (layout) or to the netlists. For example, the user can be provided a capability to click on the error to probe into or be taken to a layout editor of their choice to make, break or rewire connections as necessary to fix the LVS error. Preferably, the errors can be hierarchically represented such that the graphical logical representation of the design is hierarchical and the cells that have errors will be highlighted so that the users can drill into that cell to investigate and address the errors.

In some embodiments, the user can be provided with an appropriate user interface to select an error for correction and, in response, an appropriate layout editor called to provide the user an appropriate tool for correcting the error. For example, a mouse or other pointing device might be used to identify an error for correction by the user. The tool can be configured to call a predetermined layout editor or query the user for a desired layout editor to correct the discrepancy.

In still a further embodiment, the ability to probe from the graphical circuit representation to the layout editor can be provided to facilitate error correction with other analysis tools. In yet another embodiment, the circuit representation can be used to highlight other analysis tool results or errors. For example, a timing analysis tool or engine might be used to identify critical paths and these can be highlighted in the circuit representation.

In some applications, the sizes of the circuits that are being compared are often quite large. In such applications, a graphical circuit representation can easily become extremely dense and difficult for a user to use. Therefore, in one embodiment, the tool can be configured such that only a portion of the circuit design around an error is displayed. In other embodiments, all errors or a subset of one or more errors is displayed. For example, the tool can be configured to allow the user to 'page' through errors one at a time, or in groups at a time so that the representation can be appropriately sized for usability.

In instances where a relevant portion of the design can be a few levels deep around the device or net in error, a user may wish to investigate an area around the error or she may wish to traverse the graphical representation in making decisions and evaluating the error. Thus, in some embodiments, the number of levels (or distance) displayed in a portion of the circuit design with an error can be set to a value. This value can be a predetermined value, can be user adjustable or can be dynamically configured.

Additionally, in further embodiments, the zoomed or displayed portion of the design can be perused by the user and the connected graph (undisplayed portions) attached to the displayed portion of the design can be created on the fly based on the user's needs. This is particularly useful for large systems, where drawing the graphical representation can be time consuming. In such situations, embodiments might be implemented such that the circuit will be extended and displayed by the debug system on the fly based on the user's input requesting exploration of the design around the error. For example, the tool can be configured to generate the graphical representation on the fly as the user pans the display with their mouse.

Where a user desires to view all or a subset of errors at a given time, in some embodiments, the tool can be configured to display one or more errors according to user requirements. Accordingly, a pan and zoom feature can be provided to allow the user to look at identified areas. In some embodiments, the tool allows the user to manually pan and zoom to look for errors. In other embodiments, the tool can be configured to identify errors and automatically pan and zoom into errors.

In some embodiments, the tool can be configured to zoom to a given error and draw a determined area or number of levels around that error. This enables the user to review that error and determine what steps, if any, may be desired to rectify the error. In one embodiment, only a subset of errors is displayed at a time. For example, a determined number of one or more errors can be displayed to the user, and the user can then step or scroll through the subsets of errors one subset at a time. Such sequential viewing can accomplish objectives such as providing a simplified, uncluttered display to the user. In one embodiment, the subsets are generated on the fly, such that the entire overlay representation need not be generated at one time. In another embodiment, subsequent subsets are generated as a background process as the user peruses and operates on a given subset.

Because a user might like to see other nets to which the device in question is connected, or otherwise view areas beyond the displayed area, in one embodiment, the tool provides the capability for the user to zoom in and out of the graph to see more area or to pan to other areas. For example, the user can be provided the ability to traverse the graph to see levels beyond those displayed in the original display.

Additionally, a user interface can be provided to allow the user to control the tool in stepping through the various errors. For example, in one embodiment the user can input exploration requests via peripheral interfaces, such as mice, keyboards and keypads, and graphical interfaces such as scroll bars and graphical D-pads, and other navigation tools. In one embodiment, such peripheral interfaces can be used to allow the user to zoom in and out of the representation and traverse the representation in the X and Y dimensions.

In yet other embodiments, the tool might be implemented such that the display of errors is prioritized such as, for example, around the most critical errors. For example, in one embodiment, errors of a type that might cascade to or affect other parts of the circuit can be displayed first because, in some situations, the correction of one or more of these errors might result in the consequential correction of other errors in the layout. As one further example, in one embodiment, the system can be configured such that errors relating to open or short circuits can be displayed first and the user can be required to rectify these errors first before displaying other areas.

As noted above, in instances where the circuit is large or there is a large number of errors, the graphical representation is too dense or too large for practical viewing by the user. Therefore, another embodiment provides the user the ability to set the number of error sources to view at a given time. This might be done, for example so that the logical locality of errors can also be visually identified. As previously noted, yet a further embodiment might provide a view to a determined quantity of errors, where the number of errors displayed is, for example, determined based on viewing practicality.

In yet further embodiments where fewer than all of the errors are displayed at a given time, the tool can be configured to display only elements that are connected to a user-specified net, or only nets connected to a user specified device. The tool might further be configured to allow the user to specify additional elements or nets, and the results of additional such requests can be displayed cumulatively. As a simple example, a user might first view the Vss net and then ask to see the Vdd net. In this embodiment, the system can display both the Vss and Vdd nets together, or the system can allow the user to switch from the Vss to the Vdd net, and display only the Vdd net.

In some embodiments, the tool can be configured to allow the user to view portions of the circuit around a net or a device that is not in error. Accordingly, the tool might be configured to allow the user to zoom and pan about areas of the representation even if there are no errors in the area the user wishes to view.

Optionally, in some of the embodiments described herein, after one or more errors are corrected, the tool might be configured to rerun the comparison such that any additional errors that are "automatically" corrected by the previously corrected errors are removed from representation and the process can continue with remaining errors. Additionally, a report can be provided to the user identifying manually and automatically corrected errors. The report can be textual or in a graphical form or a combination thereof.

Figure 6:
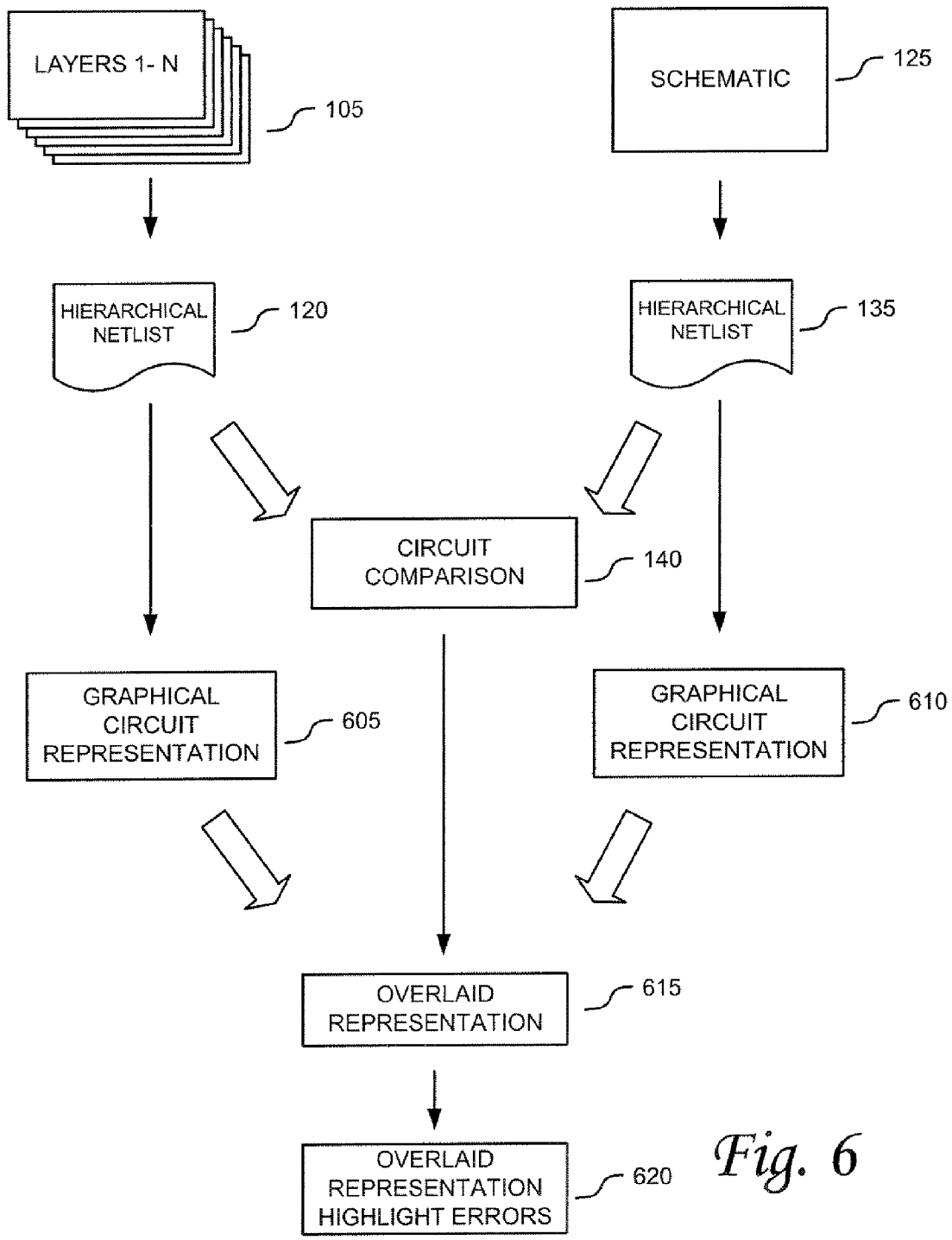
FIG. 6 is a flowchart illustrating an example process for LVS debugging in accordance with one embodiment of the invention.

FIG. 6 is a flowchart illustrating an example process for LVS debugging in accordance with one embodiment of the invention. Similar to conventional layout-versus-schematic comparison debugging operations (as illustrated in FIG. 1), FIG. 6 illustrates layout-versus-schematic processing, where the geometric shapes on different layers 105 of a layout are processed and eventually converted to hierarchical netlist 120. Similarly, schematic 125 is processed and eventually converts the data to a hierarchical netlist 135. The layout's hierarchical netlist 120 and the schematic's hierarchical netlist 135 are then compared at 140.

However, unlike a conventional layout-versus-schematic process, both a graphical circuit representation of the layout 605 and a graphical circuit representation of the schematic 610 are generated from the layout's hierarchical netlist 120 and the schematic's hierarchical netlist 135, respectively. They are used to overlay or combine the two graphical representations to produce overlaid or combined representation 615. As set forth above, this combined representation 615 highlights to the user any differences between a graphical circuit representation 605 generated by the layout's hierarchical netlist 120 and the graphical circuit representation 610 generated by the schematic's hierarchical netlist 135. In addition, any inconsistencies or errors that exist between the designer's schematic and the resultant layout (the LVS errors) are discovered during circuit comparison 140 and are eventually used to highlight the LVS errors on the overlaid representation 615. Accordingly, a combined representation with highlighted errors 620 is provided.

In one embodiment, the overlay is simply a single graphical representation of the design with differences between the layout and the schematic highlighted. As a result, inconsistencies between the desired schematic design and the resultant design that would be created by the layout can be revealed and highlighted. As described above, with reference to FIG. 5, errors or inconsistencies in the circuits can be highlighted using various highlighting techniques, such that errors are identifiable to the user.

Figure 7:
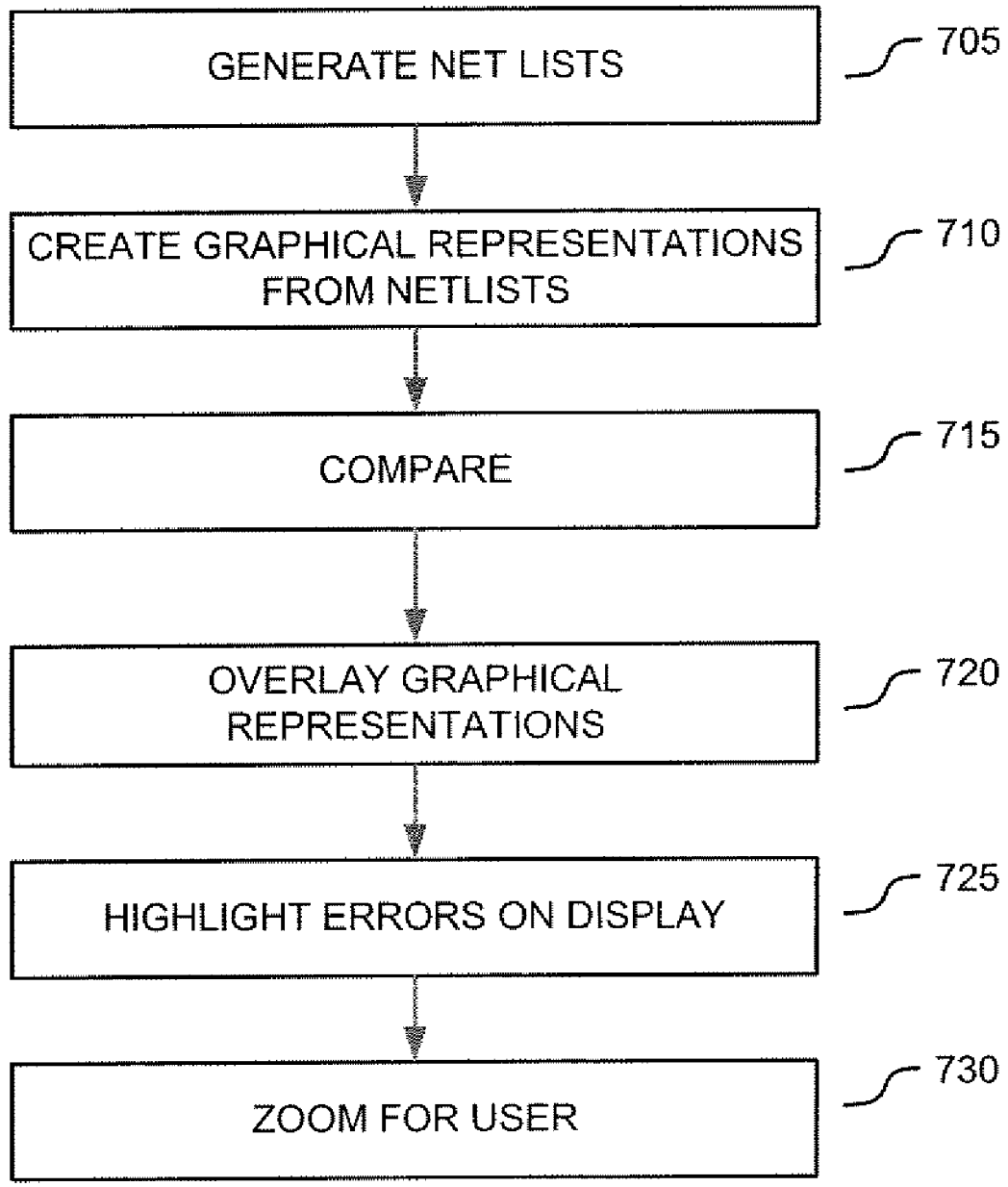
FIG. 7 is an example operational flow diagram illustrating a process for LVS error correction in accordance with one embodiment of the invention.
Figure 8:
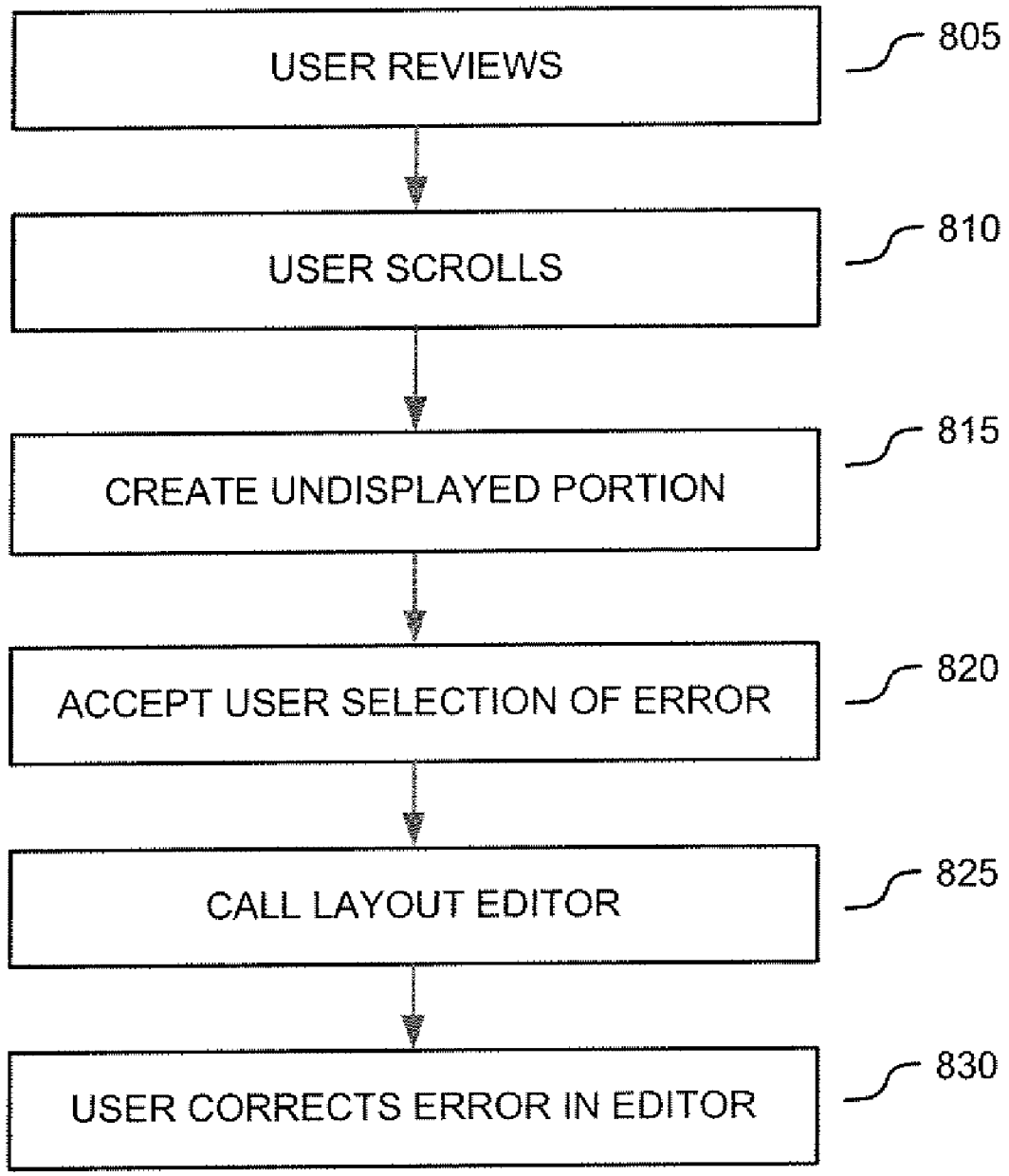
FIG. 8 is another example operational flow diagram illustrating a process for LVS error correction in accordance with one embodiment of the invention.

FIGS. 7 and 8 are example operational flow diagrams illustrating a process for LVS error correction in accordance with one embodiment of the invention. With reference to FIG. 7, at first operation 705, netlists are generated for the schematic and the intended layout. In the illustrated embodiment, the tool can be configured to generate graphical hierarchical circuit representations for the layout and the schematic from the netlist representations at operation 710. At operation 715, the tool can further be configured to compare the circuit created by the proposed layout with the circuit created by the desired schematic input. This can be accomplished, for example, by comparing the generated netlists to look for differences and similarities. In one embodiment, the underlying data is compared to detect differences. This might be similar, for example, to comparing ASCII strings across multiple files. In some embodiments, a graph-matching algorithm can be used to perform a net-by-net and a device-by-device mapping of the netlists. An overlay graphical representation is provided at operation 720. As a result of these operations, the circuit descriptions are effectively combined to illustrate the circuit depiction in a graphical representation such as an overlay representation. At operation 725, the representation is highlighted with LVS errors as described above. In some embodiments, the tool can be further configured to zoom into the highlighted errors at operation 730.

With reference to FIG. 8, an embodiment is illustrated by which a user reviews the one or more highlighted errors and corrects them in an editor. The embodiment starts at operation 805, where the user first reviews the highlighted errors and then scrolls (or pans) through other portions of overlaid representation 620 at operation 810. As stated above, the process of moving through the errors can be manually controlled by the user or automated by the tool. As the user moves through the representation to other highlighted portions, these to-be-displayed portions of the overlaid representation 620 are created at operation 815. When a user selects an error to correct at operation 820, a layout editor is called or invoked at operation 825 to allow the user to correct the error at operation 830. In one embodiment, the representation can be generated on the fly as errors are selected. In other embodiments, all or part of the representation for the entire chip or circuit can be generated in advance and stored.

Figure 9:
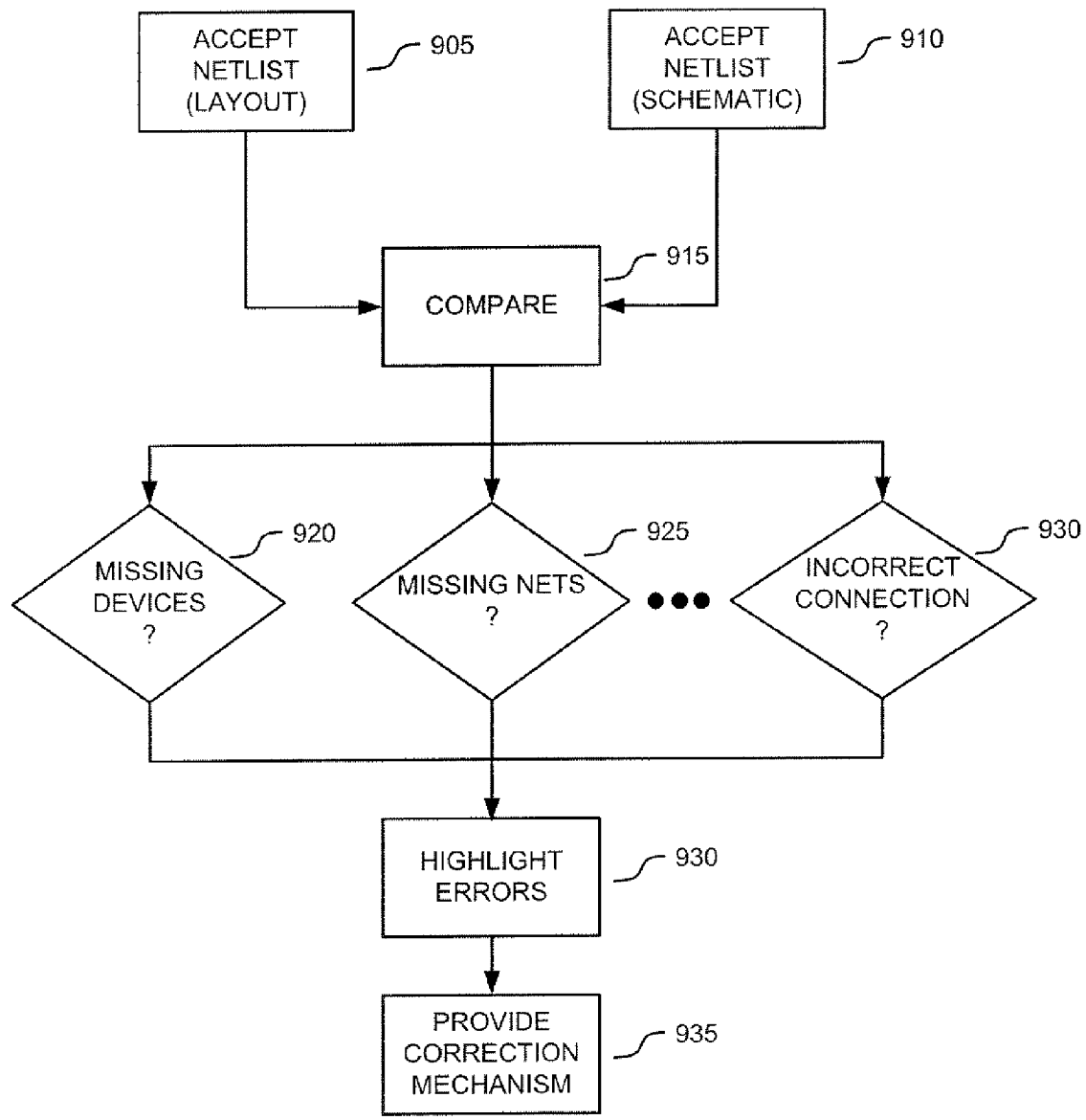
FIG. 9 is a flowchart illustrating an example of some of the errors that might be identified in accordance with one embodiment of the invention.

FIG. 9 is a flowchart illustrating an example of some of the errors that might be identified in accordance with one embodiment of the invention. Subsequent to accepting the layout's netlist and the schematic's netlist at operations 905 and 910, respectively, the two netlists are compared at operation 915 and any inconsistencies or errors are identified (missing device 920, missing nets 925, incorrect connection 930, and so on) and highlighted for the user at operation 930. For any errors that do occur, a correction mechanism can be provided at operation 935 as explained above.

Figure 10:
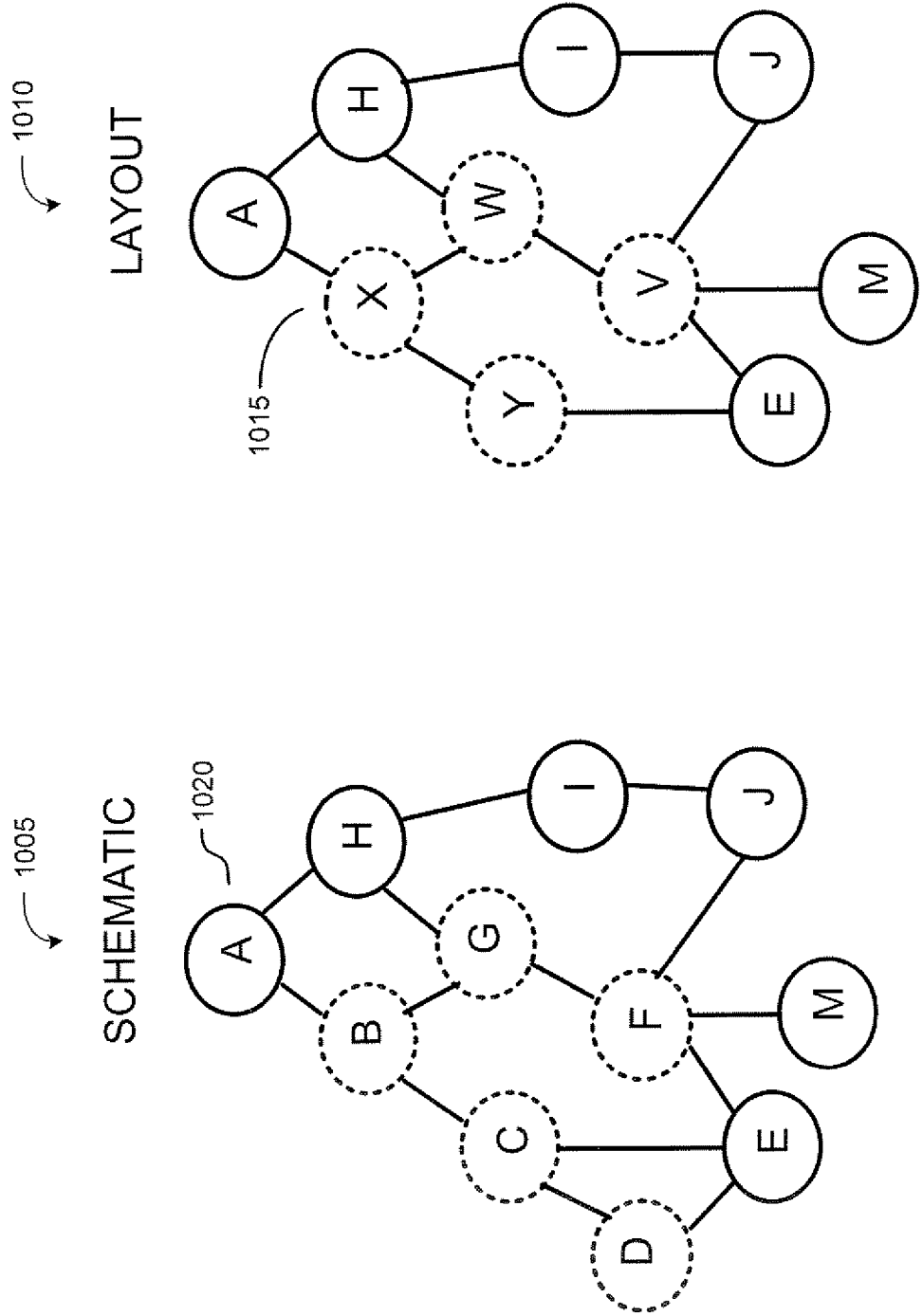
FIG. 10 is a diagram illustrating an example scenario where a schematic hierarchy is different from a layout hierarchy.

It is not unusual with semiconductor designs for the schematic representation to have a different hierarchical structure from the layout configuration. Therefore, in one embodiment, the invention can be configured to provide a user interface that allows identification of errors without tracing through the hierarchical configuration in a manual fashion as is typically necessary with traditional LVS tools. FIG. 10 illustrates an example scenario where a schematic hierarchy 1005 is different from a layout hierarchy 1010. In this example, nodes A, H, I, J, M and E are common to both the schematic hierarchy and layout hierarchy. The remaining nodes, however, are different for the schematic and layout hierarchies. However, the invention can be implemented such that these hierarchical differences are transparent or immaterial to the user for the purposes of identifying and correcting errors. For example, lower levels of hierarchy can he rolled up into the higher-level common hierarchical nodes. More important, though, where errors in the graphical representation are highlighted, the error can be identified and corrected independently of the hierarchical structure.

In one embodiment, the tool can be configured to provide the ability to inform the user where an error occurs in the original hierarchy. With continued reference to FIG. 10, assume a simple example where an error is found in node X (1015), but this node was flattened into node A (1020) for purposes of display. In this example, if the user wants to see where the elements came from, the system can be configured to provide information to the user that the elements are in hierarchical element X in the layout hierarchy. Likewise, these same elements may have originally been in a different hierarchical node in the schematic hierarchy and, accordingly, in one embodiment, the tool can be configured to inform the user regarding the hierarchical node in which they originally appeared.

As another example of how the tool might be implemented to facilitate the process of identifying LVS errors, consider an example scenario where a plurality of cells are identified as being in error because each of them is not properly connected to, for example, Vss. Further consider the example in this scenario where it is the net itself that is not connected to Vss, yet the appropriate pins of each cell are tied together in a common Vss node. In other words, only a common connection to Vss is missing. Such a problem could be difficult for a user to identify with traditional LVS systems, as errors would be flagged in the error list for each cell connected to the net. However, in one embodiment, the graphical LVS tool can be implemented such that the missing connection of the net itself to ground is highlighted on the graphical display and thus readily identifiable by the user.

The term tool can be used to refer to any apparatus or instrumentality configured to perform a recited function. Tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 11:
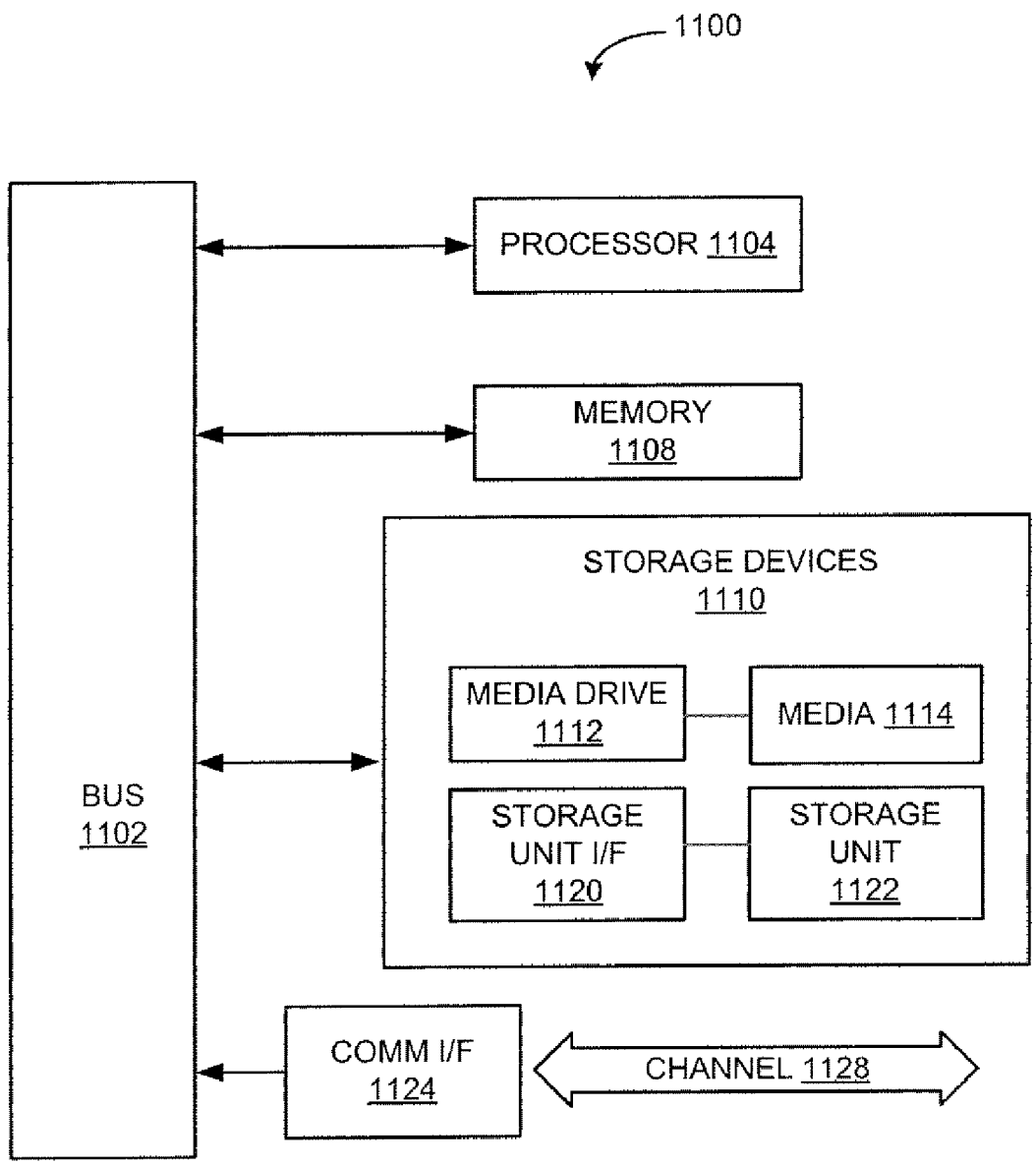
FIG. 11 is a diagram illustrating a computer system that can be used in conjunction with the systems and methods described herein.

As used herein, the term module might describe a given unit of functionality that can be performed in accordance with one or more embodiments of the present invention. As used herein, a module might be implemented utilizing any form of hardware, software, or a combination thereof For example, software code, one or more processors, controllers, ASICs, PLAs, logical components or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example computing module is shown in FIG. 11. Various embodiments are described in terms of this example computing module. After reading this description, it will become apparent to a person skilled in the relevant art how to implement the invention using other computing modules or architectures.

Referring now to FIG. 11, computing module 1100 may represent, for example, computing or processing capabilities found within desktop, laptop and notebook computers; mainframes, supercomputers, workstations or servers; or any other type of special-purpose or general-purpose computing devices as may be desirable or appropriate for a given application or environment. Computing module 1100 might also represent computing capabilities embedded within or otherwise available to a given device. For example, a computing module might be found in other electronic devices. Computing module 1100 might include, for example, one or more processors or processing devices, such as a processor 1104. Processor 1104 might be implemented using a general-purpose or special-purpose processing engine such as, for example, a microprocessor, controller, or other control logic.

Computing module 1100 might also include one or more memory modules, referred to as main memory 1108. For example, random access memory (RAM) or other dynamic memory might be used for storing information and instructions to be executed by processor 1104. Main memory 1108 might also be used for storing temporary variables or other intermediate information during execution of instructions by processor 1104. Computing module 1100 might likewise include a read only memory ("ROM") or other static storage device coupled to bus 1102 for storing static information and instructions for processor 1104.

The computing module 1100 might also include one or more various forms of information storage mechanism 1110, which might include, for example, a media drive 1112 and a storage unit interface 1120. The media drive 1112 might include a drive or other mechanism to support fixed or removable storage media 1114. For example, a hard disk drive, a floppy disk drive, a magnetic tape drive, an optical disk drive, a CD or DVD drive (R or RW), or other removable or fixed media drive. Accordingly, storage media 1114 might include, for example, a hard disk, a floppy disk, magnetic tape, cartridge, optical disk, a CD or DVD, or other fixed or removable medium that is read by, written to or accessed by media drive 1112. As these examples illustrate, the storage media 1114 can include a computer usable storage medium having stored therein particular computer software or data.

In alternative embodiments, information storage mechanism 1110 might include other similar instrumentalities for allowing computer programs or other instructions or data to be loaded into computing module 1100. Such instrumentalities might include, for example, a fixed or removable storage unit 1122 and an interface 1120. Examples of such storage units 1122 and interfaces 1120 can include a program cartridge and cartridge interface, a removable memory (for example, a flash memory or other removable memory module) and memory slot, a PCMCIA slot and card, and other fixed or removable storage units 1122 and interfaces 1120 that allow software and data to be transferred from the storage unit 1122 to computing module 1100.

Computing module 1100 might also include a communications interface 1124. Communications interface 1124 might be used to allow software and data to be transferred between computing module 1100 and external devices. Examples of communications interface 1124 might include a modem or softmodem, a network interface (such as an Ethernet, network interface card, WiMedia, 802.XX or other interface), a communications port (such as for example, a USB port, IR port, RS232 port, Bluetooth interface, or other port), or other communications interface. Software and data transferred via communications interface 1124 might typically be carried on signals, which can be electronic, electromagnetic, optical or other signals capable of being exchanged by a given communications interface 1124. These signals might be provided to communications interface 1124 via a channel 1128. This channel 1128 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 1108, storage unit 1120, media 1114, and signals on channel 1128. These and other various forms of computer program media or computer usable media may be involved in carrying one or more sequences of one or more instructions to a processing device for execution. When executed, such instructions might enable the computing module 1100 to perform features or functions of the present invention as discussed herein.

While various embodiments of the present invention have been described above, it should be understood that they have been presented by way of example only, and not of limitation. The breadth and scope of the present invention should not be limited by any of the above-described exemplary embodiments. Where this document refers to technologies that would be apparent or known to one of ordinary skill in the art, such technologies encompass those apparent or known to the skilled artisan now or at any time in the future. In addition, the invention is not restricted to the illustrated example architectures or configurations, but the desired features can be implemented using a variety of alternative architectures and configurations. As will become apparent to one of ordinary skill in the art after reading this document, the illustrated embodiments and their various alternatives can be implemented without confinement to the illustrated example. One of ordinary skill in the art would also understand how alternative functional, logical or physical partitioning and configurations could be utilized to implement the desired features of the present invention.

Furthermore, although items, elements or components of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations

What is claimed is:

1. A method of identifying layout-versus-schematic errors, comprising:
    comparing a layout netlist against a schematic netlist to identify one or more layout-versus-schematic errors;
    generating a graphical representation of the layout netlist;
    generating a graphical representation of the schematic netlist;

displaying on a display an overlay of the graphical representation of the layout netlist over the graphical representation of the schematic netlist; and highlighting the one or more identified layout-versus-schematic errors on the display.

2. The method of claim 1, wherein the step of highlighting comprises highlighting a portion of the displayed overlay using a first color to identify one or more identified layout-versus-schematic errors on the display and a second color where there are no layout-versus-schematic errors present.

3. The method of claim 1, further comprising invoking a layout editor in response to a user selecting a layout-versus-schematic error, wherein the layout editor allows the user to correct the identified layout-versus-schematic error.

4. The method of claim 1, wherein the steps of displaying the overlay and highlighting the one or more identified layout-versus-schematic errors on the display present the user with a traversable hierarchy of underlying logic of a cell.

5. The method of claim 1, wherein the step of highlighting comprises using a plurality of different highlighting styles to highlight a plurality of different classes of errors.

6. The method of claim 1, wherein the step of displaying comprises displaying a layout-versus-schematic error and a predetermined number of levels around the displayed layout-versus-schematic error.

7. The method of claim 1, further comprising toggling the display to show the graphical representation of the layout netlist, the graphical representation of the schematic netlist, and the overlay.

8. The method of claim 1, wherein the step of displaying comprises displaying only a subset of the identified layout-versus-schematic errors.

9. The method of claim 8, wherein the subset is defined by a quantity of errors, error type, error source, a specified net, or a specified device.

10. The method of claim 8, further comprising sequentially displaying a plurality of subsets of identified layout-versus-schematic errors.

11. The method of claim 1, wherein displaying the overlay comprises displaying a subset of the overlay of the graphical representation on the fly based on user input.

12. The method of claim 1, further comprising repeating the method after an identified layout versus schematic error is corrected, thereby updating the display.

13. A computer program product having instructions embedded in a non-transitory computer useable medium, the instructions configured to cause a processor to perform the operations of:
comparing a layout netlist against a schematic netlist to identify one or more layout-versus-schematic errors;
generating a graphical representation of the layout netlist;
generating a graphical representation of the schematic netlist;
displaying on a display an overlay of the graphical representation of the layout netlist over the graphical representation of the schematic netlist; and
highlighting the one or more identified layout-versus-schematic errors on the display.

14. A method comprising:
displaying an overlay of a graphical representation of a layout netlist over a graphical representation of a schematic netlist; and
identifying errors in the layout generated from the initial schematic.

15. A method of identifying layout-versus-schematic errors in a layout generated from a schematic, the method comprising displaying a graphical representation of a circuit where one or more layout errors are highlighted in the graphical representation of the circuit, wherein displaying the graphical representation includes the operations of:
comparing a layout netlist against a schematic netlist to identify one or more layout-versus-schematic errors;
generating a graphical circuit representation of the layout from the layout netlist; and
generating a graphical circuit representation of the schematic from the schematic netlist;
displaying on a display the graphical representation of the layout netlist compared with the graphical representation of the schematic netlist; and
highlighting the one or more identified layout-versus-schematic errors in the display.

16. The method of claim 15, wherein the layout errors highlighted in the graphical representation use a first color to identify one or more layout errors and a second color to identify where there are no layout errors present.

17. The method of claim 15, further comprising selecting one or more layout errors and invoking a layout editor that allows correction of the layout errors selected.

18. The method of claim 15, wherein displaying a graphical representation of the schematic results in a traversable hierarchy of underlying logic of a cell.

19. The method of claim 18, wherein the traversable hierarchy allows viewing or editing of the underlying logic of the cell.

20. The method of claim 15, wherein the layout errors highlighted in the graphical representation are a subset of the identified layout-versus-schematic errors.

21. The method of claim 20, wherein the subset is defined by a quantity of errors, error type, error source, a specified net, or a specified device.

22. The method of claim 15, wherein the graphical representation of the circuit is obtained by generating a graphical representation of the layout netlist, generating a graphical representation of the schematic netlist and combining the graphical representation of the layout netlist with the graphical representation of the schematic netlist.

23. The method of claim 15, wherein the graphical representation of the circuit is generated by comparing a schematic netlist with a layout netlist and generating a graphical circuit representation representing a combination of the schematic netlist with the layout netlist.

24. A computer-aided design apparatus configured to identify layout-versus-schematic errors in a layout generated from a schematic, the tool comprising:
a processor;
a memory connected to the processor; and
a computer readable medium having instructions embedded therein, the instructions configured to cause the processor to the operations of:
comparing a layout netlist against a schematic netlist to identify one or more layout-versus-schematic errors;
generating a graphical representation of the layout netlist;
generating a graphical representation of the schematic netlist;
displaying on a display coupled to the processor an overlay of the graphical representation of the layout netlist over the graphical representation of the schematic netlist; and
highlighting the one or more identified layout-versus-schematic errors on the display.

* * * * *